(12) United States Patent
Xie et al.

(10) Patent No.: US 10,109,533 B1
(45) Date of Patent: Oct. 23, 2018

(54) NANOSHEET DEVICES WITH CMOS EPITAXY AND METHOD OF FORMING

(71) Applicant: GLOBALFOUNDRIES INC., Grand Cayman (KY)

(72) Inventors: Ruilong Xie, Niskayuna, NY (US); Cheng Chi, Jersey City, NJ (US); Pietro Montanini, Albany, NY (US); Tenko Yamashita, Schenectady, NY (US); Nicolas Jean Loubet, Guilderland, NY (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 0 days.

(21) Appl. No.: 15/636,725

(22) Filed: Jun. 29, 2017

(51) Int. Cl.
*H01L 29/76* (2006.01)
*H01L 21/8238* (2006.01)
*H01L 27/092* (2006.01)

(52) U.S. Cl.
CPC ........ *H01L 21/823821* (2013.01); *H01L 21/823814* (2013.01); *H01L 27/092* (2013.01)

(58) Field of Classification Search
CPC ..... H01L 21/823814; H01L 21/823821; H01L 27/092
See application file for complete search history.

(56) References Cited

U.S. PATENT DOCUMENTS

| | | |
|---|---|---|
| 2014/0035059 A1 | 2/2014 | Giles et al. |
| 2016/0071729 A1 | 3/2016 | Hatcher et al. |
| 2016/0111337 A1 | 4/2016 | Hatcher et al. |

*Primary Examiner* — Samuel Gebremariam
(74) *Attorney, Agent, or Firm* — Yuanmin Cai; Hoffman Warnick LLC

(57) ABSTRACT

This disclosure relates to a method of forming nanosheet devices including: forming a first and second nanosheet stack on a substrate, the first and the second nanosheet stacks including a plurality of vertically spaced nanosheets disposed on the substrate and separated by a plurality of spacing members, each of the plurality of spacing members including a sacrificial layer and a pair of inner spacers formed on lateral ends of the sacrificial layer; growing a pair of epitaxial regions adjacent to the first and second nanosheet stacks from each of the plurality of nanosheets such that each of the plurality of inner spacers is enveloped by one of the epitaxial regions; covering the first nanosheet stack with a mask; and forming a pair of p-type source/drain regions on the second nanosheet stack, each of the pair of p-type source/drain regions being adjacent to the epitaxial regions on the second nanosheet stack.

10 Claims, 18 Drawing Sheets

NANOSHEET DEVICES WITH CMOS EPITAXY AND METHOD OF FORMING

BACKGROUND

Technical Field

The present disclosure relates to integrated circuit design, and more particularly to forming epitaxy layers on complementary metal-oxide-semiconductor (CMOS) nanosheet transistor devices.

Related Art

Field-effect transistors (FETs) typically include doped source/drain regions that are formed in a semiconductor substrate and separated by a channel region. A nanosheet transistor refers to a type of FET that includes a plurality of stacked nanosheets extending between a pair of source/drain regions, forming a channel. Nanosheet transistors may be known as "gate-all-around" transistors in part because the gate is structured to wrap around the channel. In other words, nanosheet transistors may include a gate that wraps around each of the nanosheets. Another type of gate-all-around transistor is a nanowire transistor. Nanowire transistors may be similar to nanosheet transistors, except the channel may include nanowires instead of nanosheets. This gate-all-around structure can provide very small devices with better switching control, lower leakage current, faster operations, and lower output resistance.

Nanosheet devices may be difficult to manufacture because of the very small size of the devices. For example, in very small devices such as nanosheet FETs, small variations in manufacturing may change electrical properties of the device, and may also decrease reliability and longevity of the device. In these cases, it may be beneficial to protect certain components of the device during manufacturing to increase yield and reliability of the device.

SUMMARY

A first aspect of the disclosure provides a method including: forming a first and second nanosheet stack on a substrate, the first and the second nanosheet stacks each including a plurality of vertically spaced nanosheets disposed on the substrate and separated by a plurality of spacing members, each of the plurality of spacing members including a sacrificial layer and a pair of inner spacers formed on lateral ends of the sacrificial layer; growing a pair of epitaxial regions adjacent to each of the first and the second nanosheet stacks from each of the plurality of nanosheets such that each of the plurality of inner spacers is enveloped by one of the epitaxial regions; covering the first nanosheet stack with a mask; and forming a pair of p-type source/drain regions on the second nanosheet stack, each of the pair of p-type source/drain regions being adjacent to one of the epitaxial regions on the second nanosheet stack.

A second aspect of the disclosure provides a semiconductor device including: a first and second nanosheet stack on a substrate, the first and the second nanosheet stack being adjacent to each other and each including vertically spaced nanosheets; a pair of semiconductor layers disposed on the second nanosheet stack in contact with sidewalls of the nanosheets of the second nanosheet stack, each of the pair of semiconductor layers extending vertically from a lowermost nanosheet of the second nanosheet stack to an uppermost nanosheet of the second nanosheet stack; a pair of n-type source/drain regions disposed on the substrate adjacent to the first nanosheet stack; and a pair of p-type source/drain regions disposed on the substrate adjacent to the second nanosheet stack and in direct contact with the pair of semiconductor layers.

BRIEF DESCRIPTION OF THE DRAWINGS

The embodiments of this disclosure will be described in detail, with reference to the following figures, wherein like designations denote like elements, and wherein.

DETAILED DESCRIPTION

Figure 1:
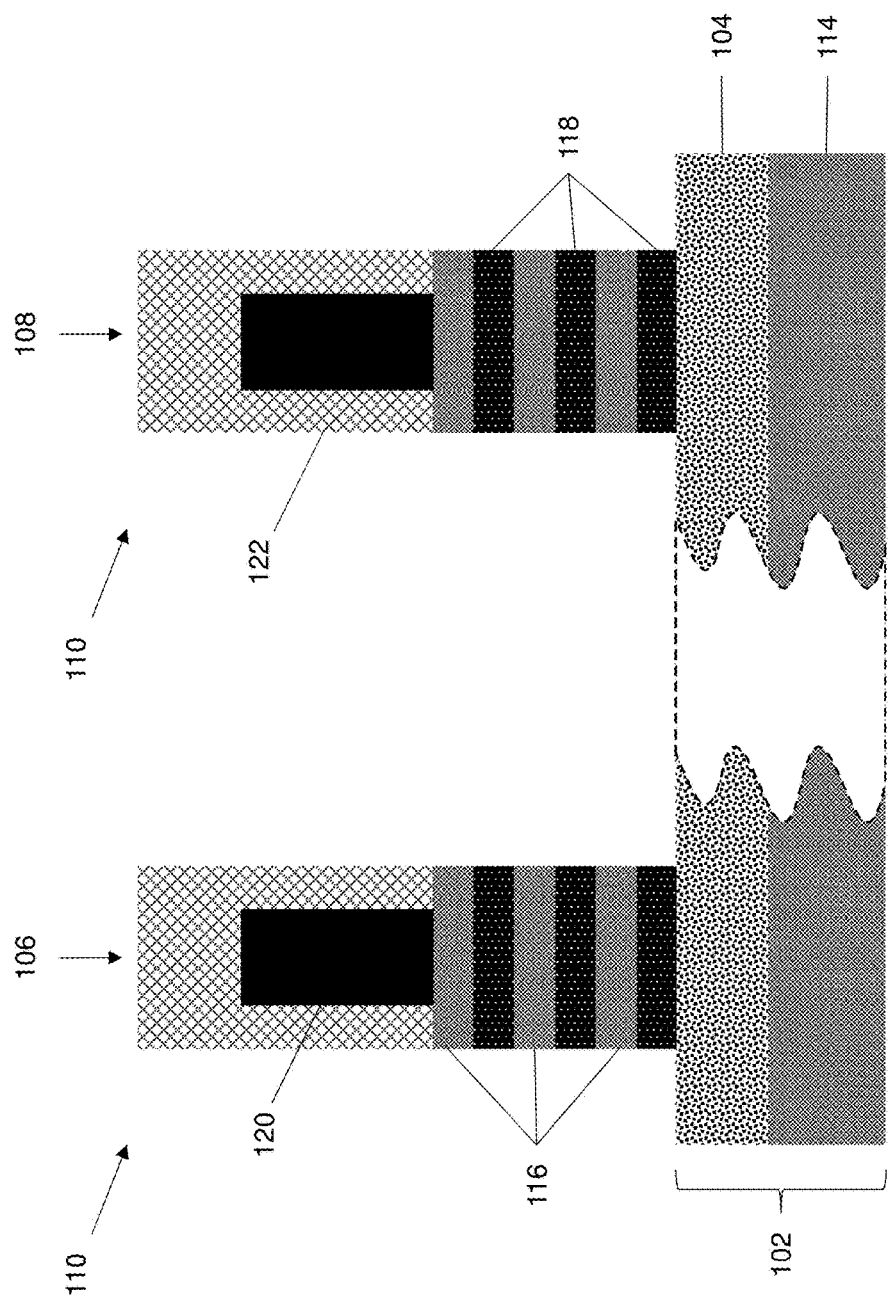
FIG. 1 shows a cross sectional view of a plurality of nanosheet stacks in accordance with the present disclosure.

As noted above, nanosheet devices may be difficult to manufacture because of the very small size of the devices.

For example, in very small devices such as nanosheet FETs, small variations in manufacturing may change electrical properties of the device, and may also decrease reliability and longevity of the device. In these cases, it may be beneficial to protect certain components of the device during manufacturing to increase yield and reliability of the device.

Some methods of forming nanosheet devices may include a replacement-metal-gate (RMG) process to replace an original dummy gate with a metal gate. An RMG process can be used to prevent damage to the final gate metal during manufacturing. Manufacturing nanosheet devices may include initially forming a dummy gate on a stack of nanosheets, and sacrificial layers between the nanosheets. The sacrificial layers between the nanosheets may include inner spacers formed on lateral ends thereof. Inner spacers may protect the sacrificial layers during manufacturing. The dummy gate and sacrificial layers may later be replaced by a metal gate with a RMG process as described above.

As one particular example, some integrated circuit (IC) designs include PFET devices adjacent to NFET devices. Such IC designs may be known as bimetallic integrated circuits. A NFET is a FET having an n-channel in which the current carriers are electrons. A PFET is a FET having a p-channel in which the current carriers are holes. Source/drain regions of a NFET device may include a different material than source/drain regions of a PFET device. It may be difficult to accurately manufacture very small adjacent NFET and PFET nanosheet devices.

One example of difficulty in manufacturing such a configuration is in the process of selectively applying p-type source/drain regions on PFET devices that are directly adjacent to NFET devices. Such a process may typically include covering a NFET device and an adjacent PFET device with a first mask, selectively removing the first mask to expose the PFET device, forming p-type source/drain regions on the PFET device, removing the remaining first mask, covering the NFET and PFET devices with a second mask, selectively removing the second mask to expose the NFET device, and forming n-type source/drain regions on the NFET device.

Each of the above-referenced masks may be typically formed over each nanosheet stack in contact with lateral ends of the nanosheets and lateral ends of the inner spacers between the nanosheets. Each of the three above-referenced mask removal steps typically includes an etch process. At such a small scale, it may be difficult to perfectly align such an etch process. An etch that removes all of the liner may also remove part of the nanosheets and/or the inner spacers between the nanosheets. Removing part of the inner spacers may negatively affect the electrical characteristics and reliability of the resulting device. On the other hand, an etch applied at a distance away from the inner spacers may not remove all of the mask from the nanosheets. In such a case where the nanosheets remain covered or partially covered by the mask, it may be difficult to epitaxially grow semiconductor material from the nanosheets in later manufacturing processes. As described above, such a typical manufacturing process may include many etching steps in proximity of the inner spacers that require perfect alignment in order to create a device that meets design specifications. It may not be feasible to include multiple processes that have such a narrow margins for success.

Embodiments of the present disclosure provide methods for epitaxial source/drain formation for nanosheet transistor devices that may be used in integrated circuits (IC). The present disclosure will describe a method applied to nanosheet devices as an example, but it should be understood that the method could also be applied to nanowire devices.

As described above, some nanosheet FETs may include inner spacers between nanosheets to stabilize and electrically isolate portions of the nanosheet device. If the inner spacers are damaged or otherwise end up outside of the design specification, the electrical properties of the resulting nanosheet FET may render the device inoperable or unreliable. For example, if an etch removes a portion of the inner spacer, the electrical properties of the resulting device may be outside of design specifications. On the other hand, if an etch is applied farther from the inner spacer to ensure that the inner spacer remains intact, the nanosheets may not be sufficiently exposed for later epitaxial growth processes. If the nanosheets are not sufficiently exposed, it may be difficult or impossible to epitaxially grow source/drain regions from the nanosheets. It may not be feasible to include multiple processes that have a narrow margins for success because of an exposed inner spacer.

The present disclosure provides a method of forming epitaxial source/drain regions on adjacent NFET and PFET nanosheet devices while protecting the inner spacers. Protecting the inner spacer may reduce the number of manufacturing processes that have a narrow margin for success. Other benefits of the present disclosure may be clear from the detailed description.

It is to be understood that the present disclosure will be described in terms of a given illustrative architecture having a silicon substrate, however other architectures, structures, substrate materials, and process features and steps may be varied within the scope of the present disclosure.

It will also be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Methods as described herein may be used in the fabrication of IC chips. The resulting integrated circuit chips may be integrated with other chips, discrete circuit elements, and/or other signal processing devices as part of either (a) an intermediate product, such as a motherboard, or (b) an end product. The end product can be any product that includes integrated circuit chips.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment.

It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Referring now to the drawings in which like numerals represent the same or similar elements, FIG. 1 depicts a plurality of preexisting nanosheet devices 110. Forming preexisting nanosheet devices 110 may include forming a first nanosheet stack 106 and a second nanosheet stack 108 on a substrate 102. FIG. 1 shows a phantom discontinuity between first nanosheet stack 106 and second nanosheet stack 108 to make clear that first nanosheet stack 106 and second nanosheet stack 108 may be formed on the same substrate 102, but not necessarily directly adjacent to each other. In one embodiment, first nanosheet stack 106 may be formed directly adjacent to second nanosheet stack 108, however as shown by the phantom section, such a configuration is not required. In one embodiment, first nanosheet stack 106 may be formed some distance from second nanosheet stack 108 on the same substrate 102. The phantom discontinuity between nanosheet stacks 106, 108 carries through each of the FIGS. and serves the same purpose throughout. Substrate 102 may include a silicon substrate, a doped silicon substrate, a silicon-on-insulator (SOI) substrate, or other substrate material without departing from the present disclosure. For example, substrate 102 may include a semiconducting material including but not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). In one embodiment, substrate 102 may optionally include a dielectric layer 104 on a semiconductor substrate layer 114.

Each of the nanosheet stacks 106, 108 may include a plurality of alternating nanosheets 116 and sacrificial layers 118. In one embodiment, nanosheet stacks 106, 108 may include at least one nanosheet 116 each. In one embodiment, nanosheet stacks 106, 108 may include three nanosheets 116 each. Sacrificial layers 118 may include silicon germanium (SiGe), or other semiconductor materials. In one particular embodiment, sacrificial layers 118 may include SiGe. Nanosheets 116 may include a semiconducting material such as one of the materials listed above for substrate 102. In one embodiment, nanosheets 116 may include undoped silicon (Si). A gate 120 may be disposed on each of the nanosheet stacks 106, 108. Gate 120 may include a metal material or a semiconductor material. In one embodiment, gate 120 may be a dummy gate including semiconductor material. In one embodiment, gate 120 may include amorphous silicon (a-Si) disposed on a thin silicon dioxide ($SiO_2$) layer (not shown). In one embodiment, a gate hard mask 122 may be formed over gate 120. Gate hard mask 122 may include a dielectric material such as silicon nitride (SiN).

Figure 2:
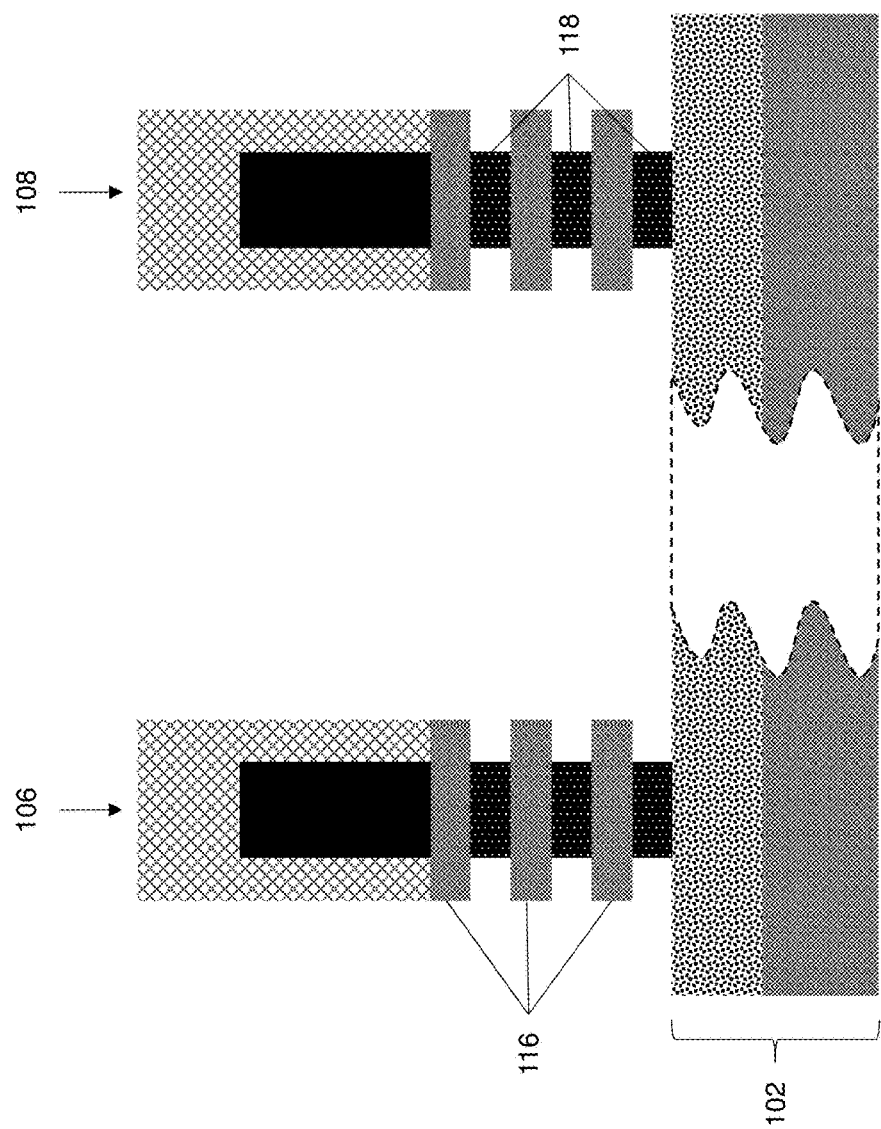
FIG. 2 shows a cross sectional view of recessing the sacrificial layers between the nanosheets in accordance with the present disclosure.

FIG. 2 shows a process of recessing sacrificial layers 118. As shown, a portion of sacrificial layers may be removed. Sacrificial layers 118 may be removed by any now known or later developed techniques for removing sacrificial layers 118 selective to nanosheets 116. For example, sacrificial layers 118 may be recessed using hot $NH_4OH:H_2O_2:H_2O$, or a vapor phase HCl etch. In one embodiment, recessing sacrificial layers 118 may include removing SiGe sacrificial layers 118 selective to undoped silicon nanosheets 116. As used herein "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

Figure 3:
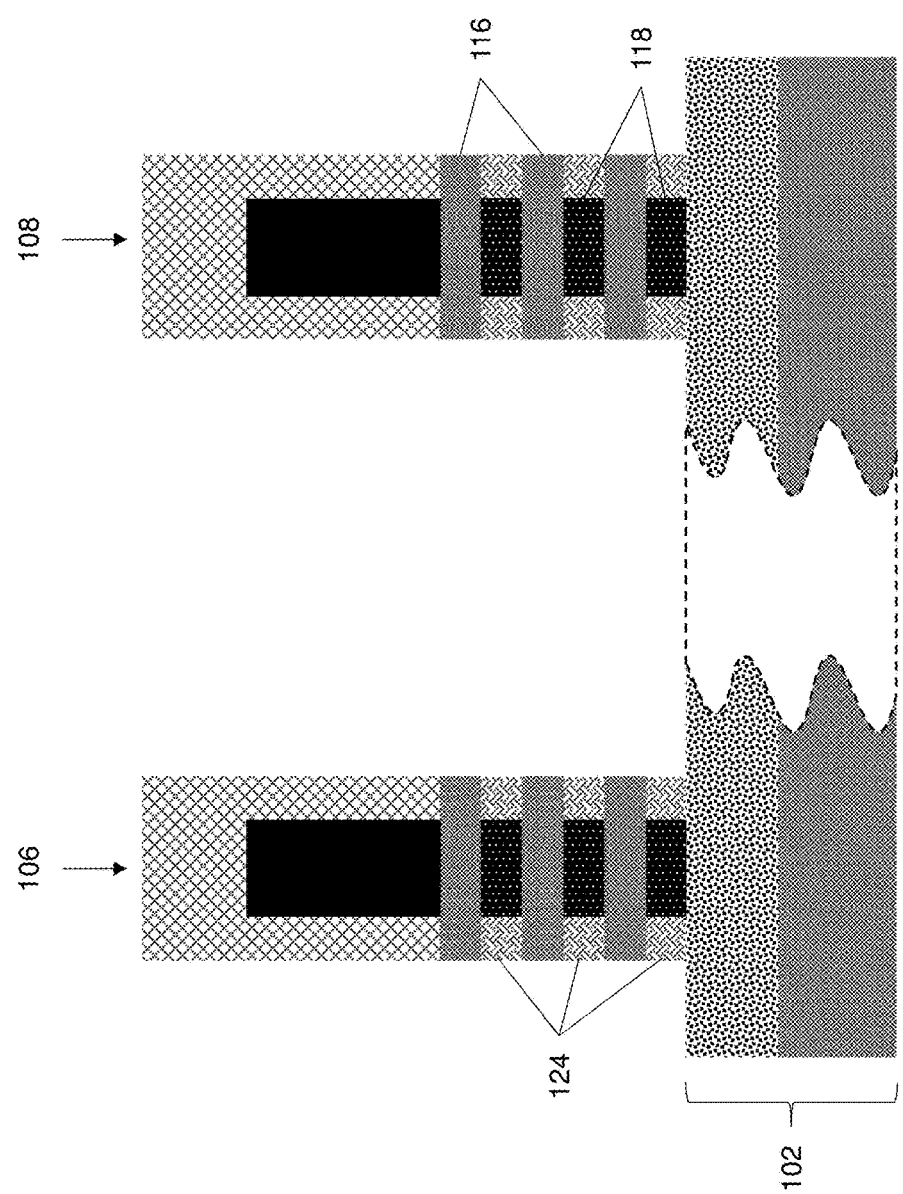
FIG. 3 shows a cross sectional view of forming a plurality of inner spacers in accordance with the present disclosure.

FIG. 3 shows a process of forming a plurality of inner spacers 124. Inner spacers 124 may include a single dielectric layer (shown), such as silicon nitride (SiN), formed between nanosheets 116 on lateral ends of sacrificial layers 118 (i.e., where material was removed from lateral ends of sacrificial layers 118). In one embodiment, inner spacers 124 may be bi-layer spacers including a nitride layer disposed on an oxide layer (not shown). For example, inner spacers 124 may include an inner $SiO_2$ layer formed on lateral ends of sacrificial layer 118 and an outer SiN layer disposed on the $SiO_2$ layer. Together, inner spacers 124 and sacrificial layers 118 may form spacing members 118, 124 that are formed between and separate each of the plurality of nanosheets 116. Inner spacers 124 may be formed by a spacer pull-down process, atomic layer deposition (ALD), or any other now known or later developed techniques for forming a dielectric layer on lateral ends of sacrificial layers 118. In a particular embodiment, inner spacers 124 may be formed by, after recessing sacrificial layers 118, depositing a conformal layer (not shown) of dielectric material by atomic layer deposition, and then removing the conformal layer (not shown) except between nanosheets 116. The portion of the conformal layer left between nanosheets 116 may be inner spacers 124.

Figure 4:
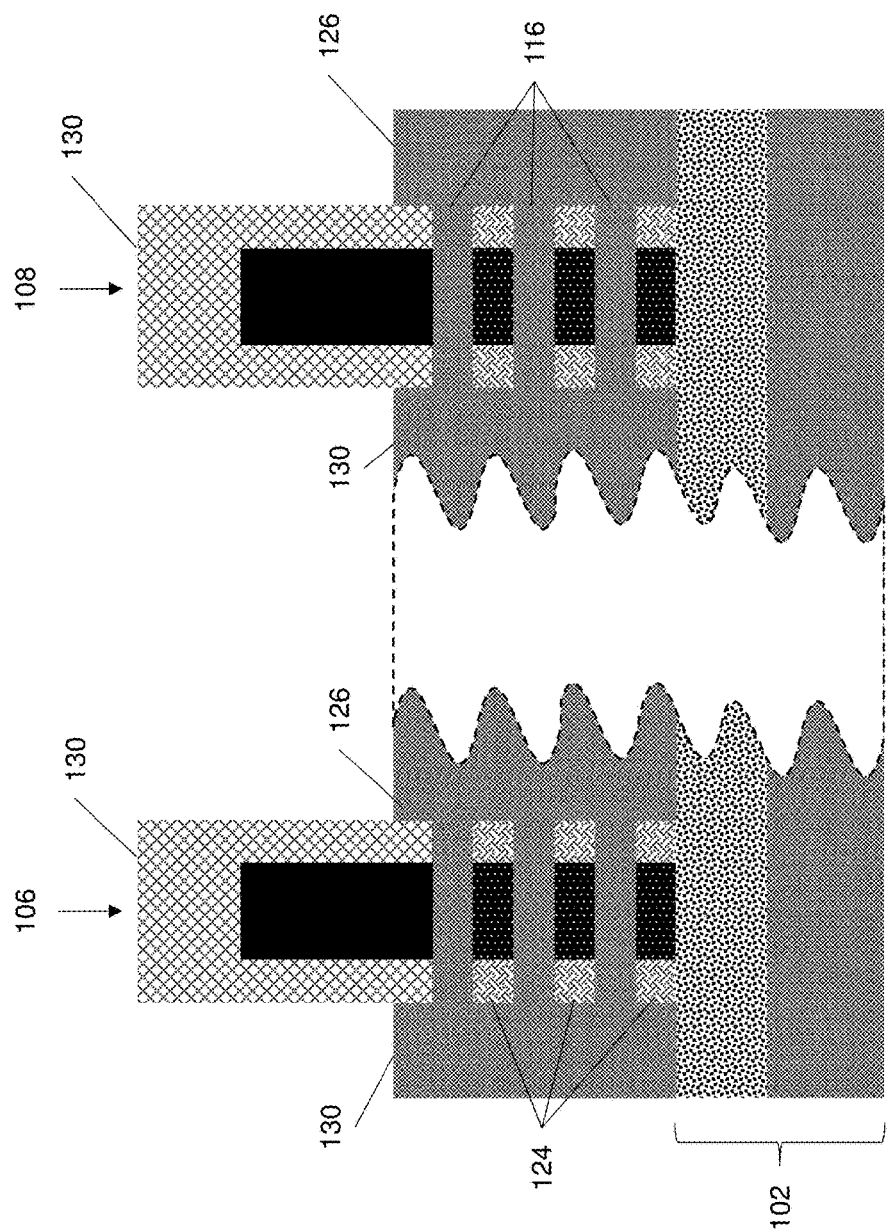
FIG. 4 shows a cross sectional view of growing a first epitaxial region in accordance with the present disclosure.

FIG. 4 shows a process of growing a first epitaxial region 126 adjacent to nanosheet stacks 106, 108. The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Returning to FIG. 4, first epitaxial region 126 may be epitaxially grown from nanosheets 116. Epitaxially growing first epitaxial region 126 may include vapor-phase, liquid-phase, or solid-phase epitaxy, or any other now known or later developed techniques for growing epitaxial silicon from silicon nanosheets. As shown in FIG. 4, first epitaxial region 126 may be grown such that it envelopes (i.e., completely surrounds, seals, or covers) inner spacers 124. First epitaxial region 126 may provide physical support for the fragile (i.e., very small and subject to tight manufacturing tolerances) inner spacers 124 and nanosheets 116. In one embodiment, first epitaxial region 126 may include undoped silicon (Si). One advantage of forming first epitaxial region 126 from undoped silicon may be that undoped silicon may not introduce any dopants to the junction between nanosheets 116 and first epitaxial region 126.

Figure 5:
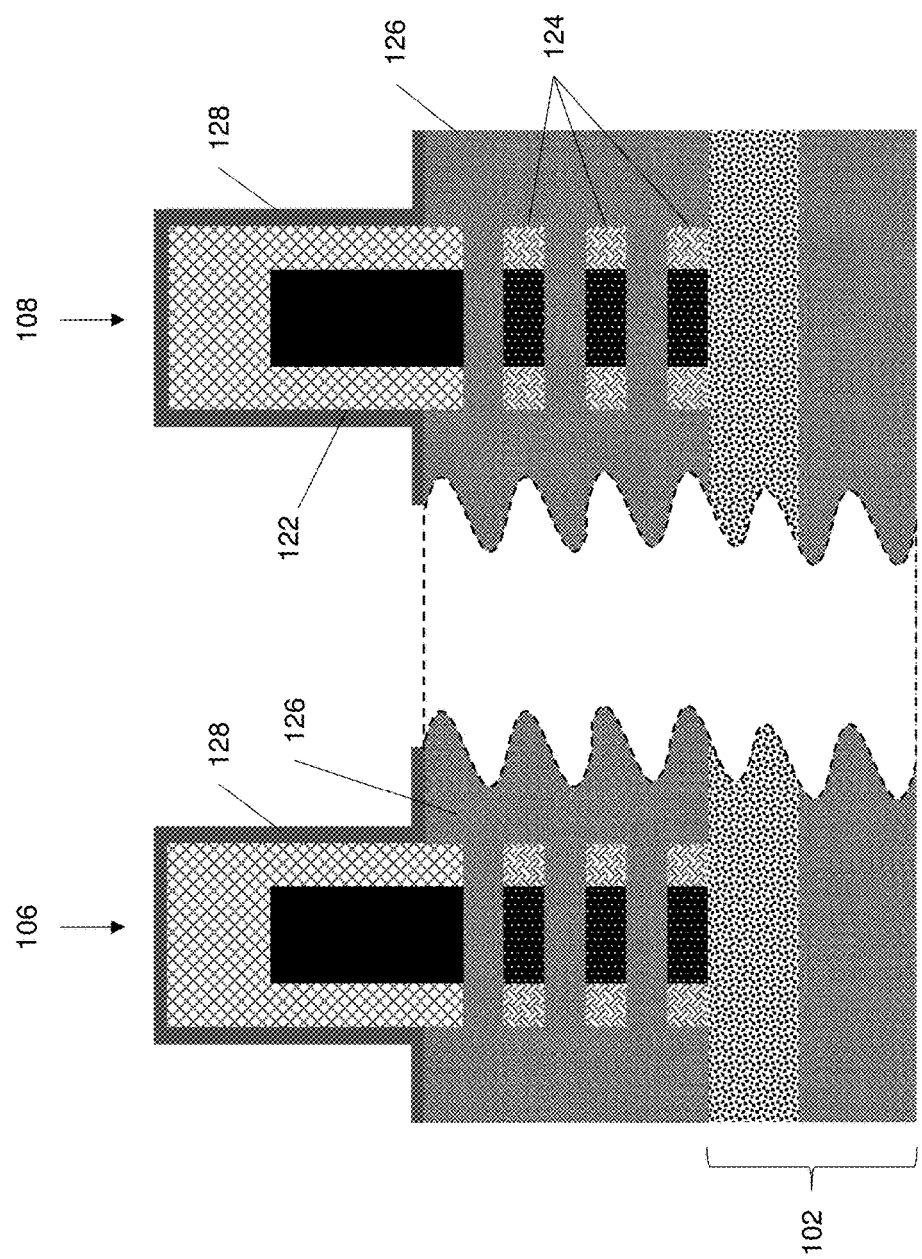
FIG. 5 shows a cross sectional view of forming a liner over the nanosheet stacks in accordance with the present disclosure.

FIG. 5 shows a process of forming a first liner 128 on an exposed surface 130 (shown in FIG. 4) of nanosheet stacks 106, 108. In one embodiment, first liner 128 may be formed conformally over exposed surface 130. In such an embodiment, first liner 128 may be conformally formed on first epitaxial region 126, and gate hard mask 122. It should be noted that first epitaxial region 126 may prevent first liner 128 from being formed on inner spacers 124. One advantage of this embodiment may be that inner spacers 124 may be protected from the liner deposition shown in FIG. 5 as well as any subsequent deposition and etching processes that might otherwise damage inner spacers 124. In one embodiment, first liner 128 may include a dielectric material such as SiN (silicon nitride), SiBCN (silicon borocarbonitride), SiOCN (silicon oxycarbonitride), SiCO (silicon oxycarbide), or SiO$_2$ (silicon dioxide). In one particular embodiment, first liner 128 may include SiN.

Figure 6:
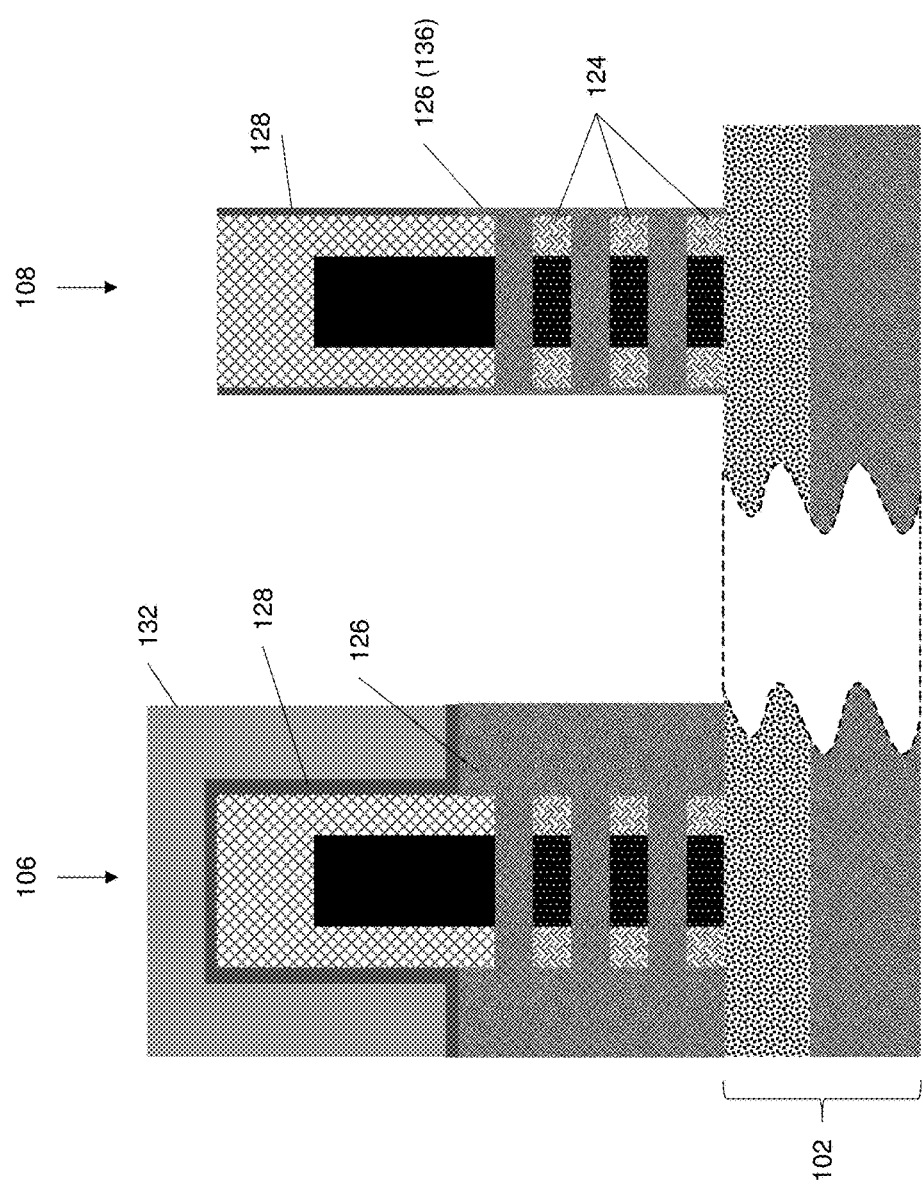
FIG. 6 shows a cross sectional view of removing a portion of the first epitaxial region on the second nanosheet stack in accordance with the present disclosure.

FIG. 6 shows the result of processes including masking first nanosheet stack 106, exposing second nanosheet stack 108, and partially removing first epitaxial region 126 on second nanosheet stack 108. The result of these processes is shown in a single drawing for brevity. In one embodiment, a soft mask 132 may be deposited on nanosheet stacks 106, 108. Soft mask 132 may include an organic planarization layer (OPL) or other suitable soft mask material. Soft mask 132 may be deposited directly on first liner 128 covering nanosheet stacks 106, 108. In one embodiment, soft mask 132 may include a patterning mask such as a photoresist mask (not shown separately) that may be deposited over the OPL. The photoresist mask may be patterned and etched (i.e., lithography) to expose second nanosheet stack 108 while first nanosheet stack 106 remains masked, as shown in FIG. 6. The process of exposing second nanosheet 108 may include removing soft mask 132 from second nanosheet stack 108 and removing first liner 128 from first epitaxial region 126 on second nanosheet stack 108. In one embodiment, first liner 128 may be removed with an etch selective to first epitaxial region 126. In one embodiment, first liner 128 may be removed with a timed anisotropic etch such that horizontal portions of first liner 128 are removed from first epitaxial region 126, but vertical portions of first liner 128 remain on sidewalls of gate hard mask 122, as shown. FIG. 6 also shows the result of a process including partially removing first epitaxial region 126 on second nanosheet stack 108. First epitaxial region 126 on second nanosheet stack 108 may be partially removed with an anisotropic etch selective to substrate 102 and vertical portions of first liner 128 to reduce a width of first epitaxial region 126 on second nanosheet stack 108 such that each of the plurality of inner spacers 124 of second nanosheet stack 108 remains enveloped by one first epitaxial region 126 on the second nanosheet stack 108. In one embodiment, as shown in FIG. 6, the remaining portion of first liner 128 on second nanosheet stack 108 may act as a mask such that inner spacers 124 remain enveloped by a portion of first epitaxial region 126.

Figure 7:
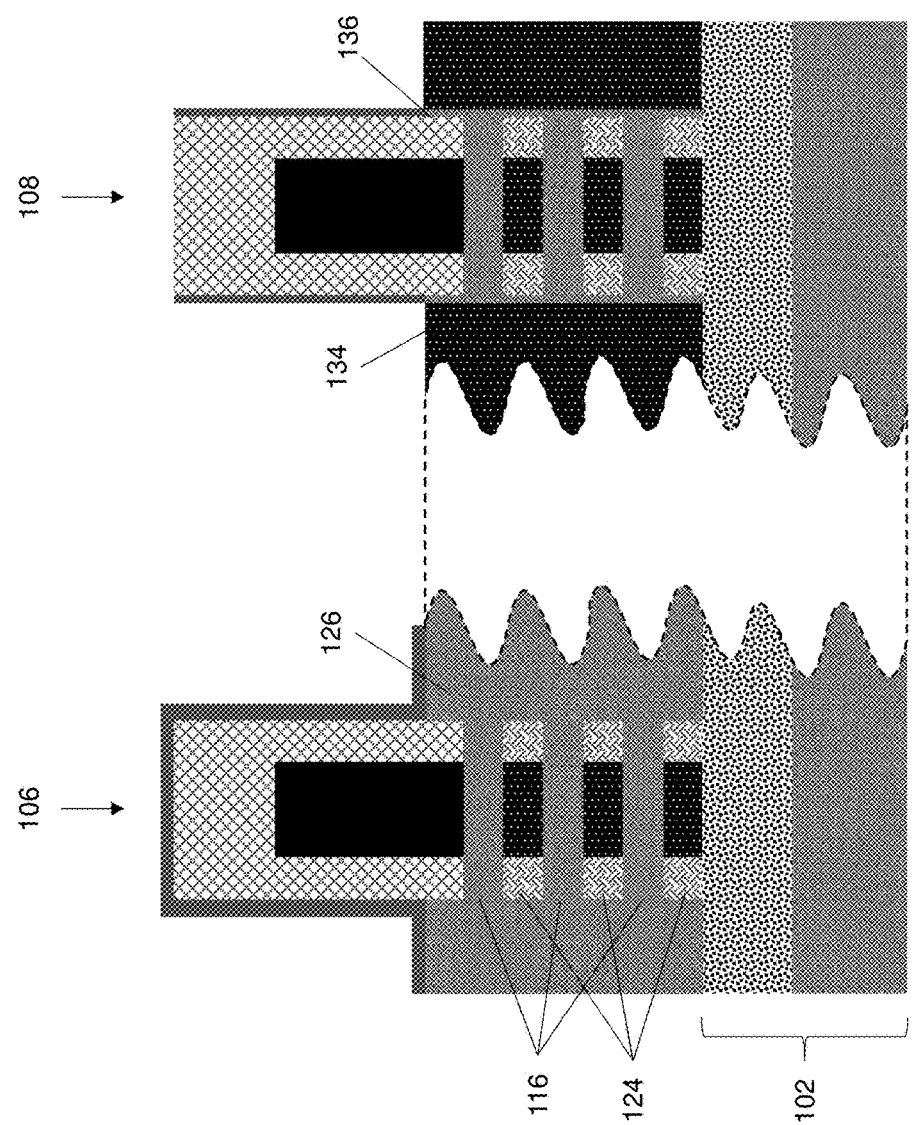
FIG. 7 shows a cross sectional view of forming p-type source/drain regions on the second nanosheet stack in accordance with the present disclosure.

FIG. 7 shows processes including removing soft mask 132 (soft mask 132 shown in FIG. 6) from first nano sheet stack 106 and forming a pair of p-type source/drain regions 134 on second nanosheet stack 108. In one embodiment, p-type source/drain regions 134 may be epitaxially grown doped silicon germanium (SiGe), silicon, or silicon-germanium-tin (SiGeSn). In one embodiment, p-type source/drain regions may include p-type dopants such as boron, gallium, or indium. In one particular embodiment, p-type source/drain regions may include boron-doped SiGe. P-type source/drain regions 134 may be epitaxially grown from remaining portions 136 of first epitaxial region 126. One advantage of this embodiment may be that the remaining portions of first epitaxial region 136 envelope and protect inner spacers 124. Another possible advantage of the present embodiment is that it may be quicker and/or easier to reliably grow p-type source/drain regions 134 from the remaining portion of first epitaxial region 136 compared to epitaxially growing p-type source/drain regions 134 from nanosheets 116 because of the larger uniform surface area of the remaining portion of first epitaxial region 136 compared to sidewalls of nanosheets 116.

Figure 8:
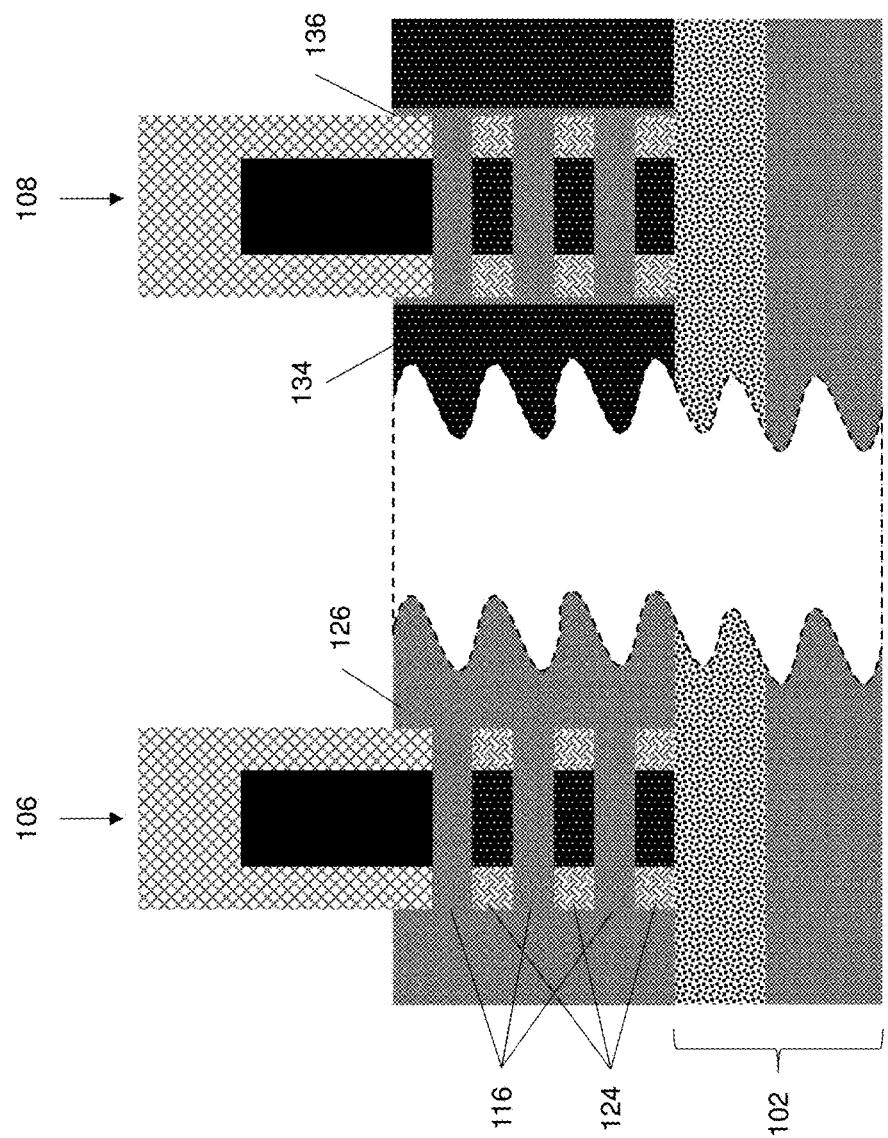
FIG. 8 shows a cross sectional view of removing the liner in accordance with the present disclosure.

FIG. 8 shows a process of removing first liner 128 (liner 128 shown in FIG. 7) from nanosheet stacks 106, 108. First liner 128 may be removed by an etch selective to first epitaxial region 126. At this point, first nanosheet stack 106 may still include the whole first epitaxial region 126 that was formed as described above regarding FIG. 4. Second nanosheet stack 108 may include p-type source drain regions 134 formed on remaining portion of first epitaxial region 136. In one embodiment, remaining portion of first epitaxial region 136 may include a pair of undoped silicon layers extending vertically from a lowermost one of nanosheets 116 of second nanosheet stack 108 to an uppermost one of nanosheets 116 of second nanosheet stack, as shown. In one embodiment, remaining portion of first epitaxial region 136 may connect and extend between the outermost portions of nanosheets 116 on second nanosheet stack 108. In one embodiment, remaining portion of first epitaxial region 136 may be directly between inner spacers 124 and p-type source drain regions 134 on second nanosheet stack 108.

Figure 9:
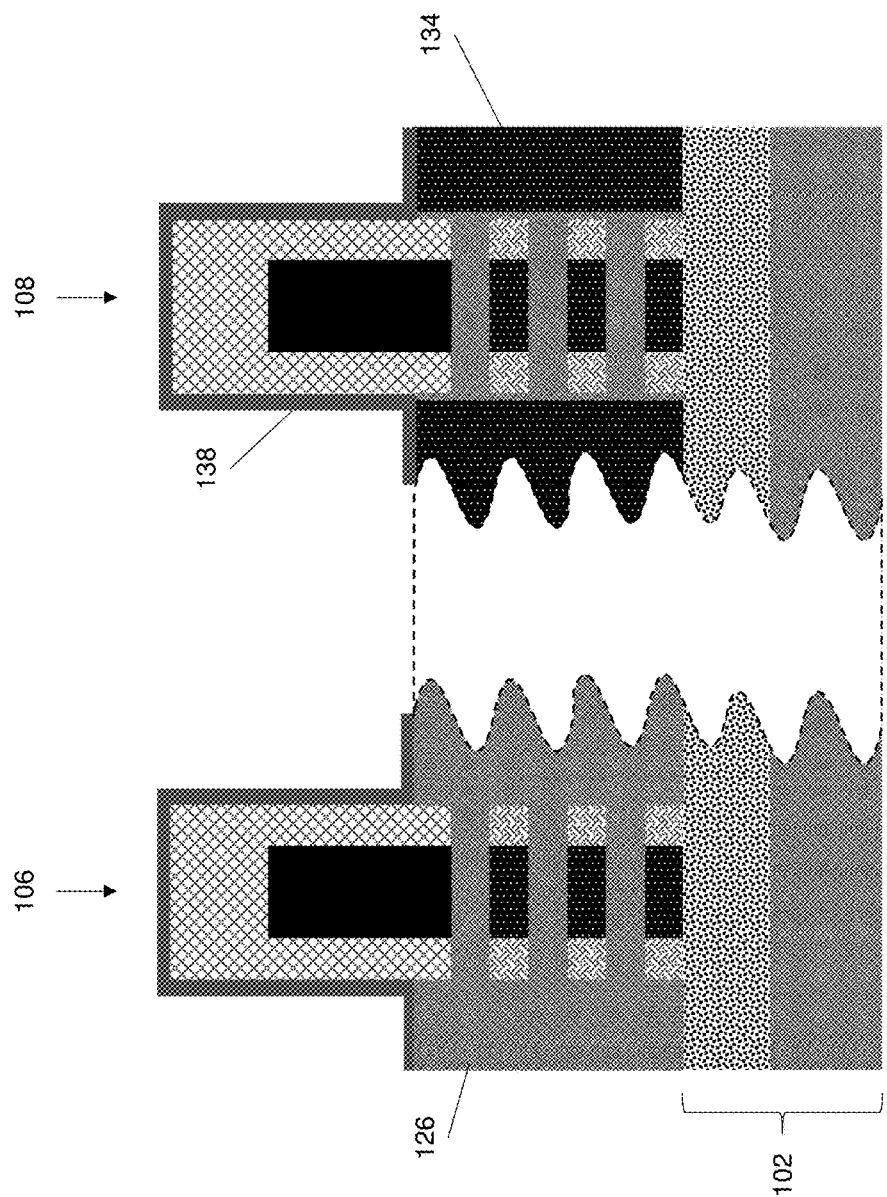
FIG. 9 shows a cross sectional view of forming a second liner in accordance with the present disclosure.

FIG. 9 shows a process of forming second liner 138 on nanosheet stacks 106, 108. Second liner may be formed on nanosheet stacks 106, 108 similarly to first liner 128 discussed above regarding FIG. 5. Similar to first liner 128, second liner 138 may include a dielectric material. Second liner 138 may include any of the materials listed above for first liner 128. In one particular embodiment, second liner 138 may include silicon nitride (SiN). Also, similar to first liner 128, second liner 138 may be conformally formed over nanosheet stacks 106, 108 such that second liner is formed on first epitaxial region 126 on first nanosheet stack 106, and on p-type source/drain regions 134 of second nanosheet stack 108.

Figure 10:
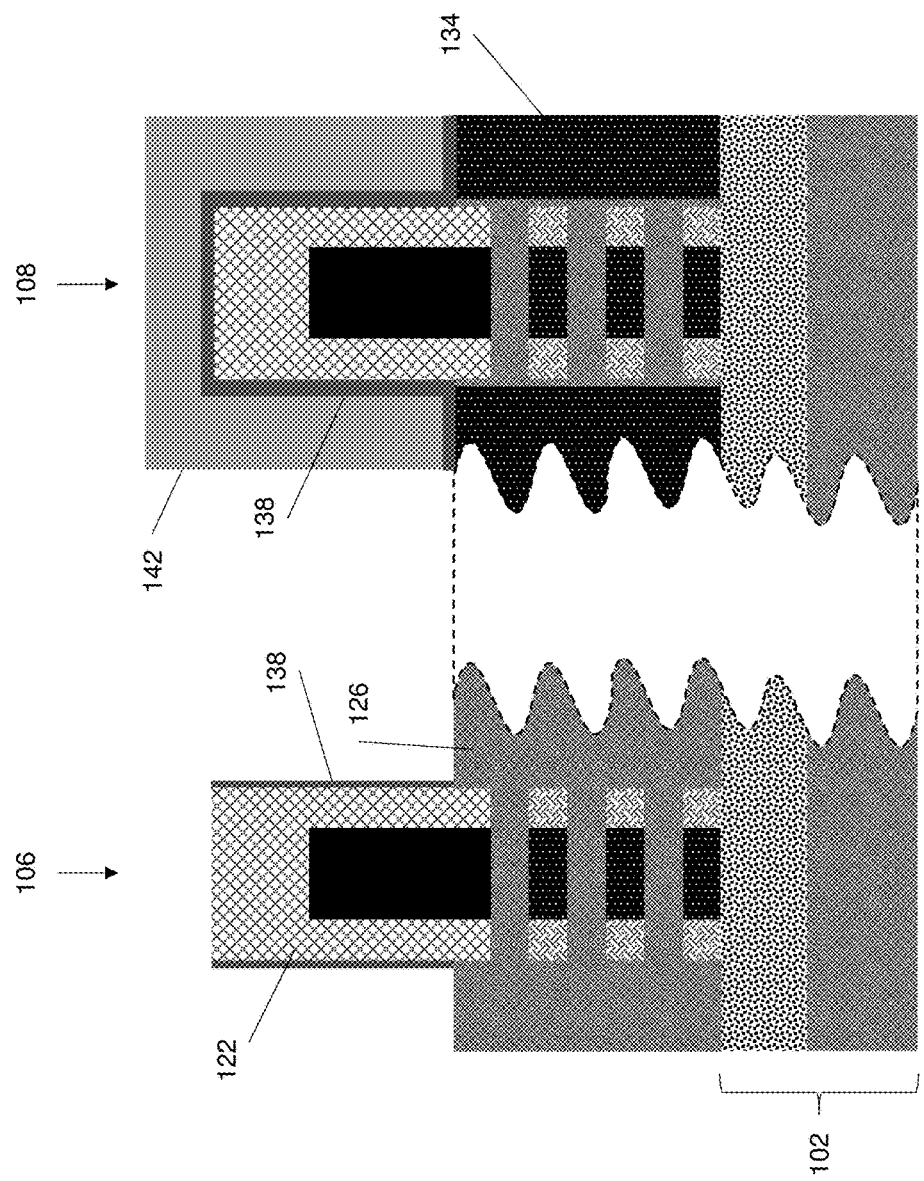
FIG. 10 shows a cross sectional view of masking the second nanosheet stack in accordance with the present disclosure.
Figure 11:
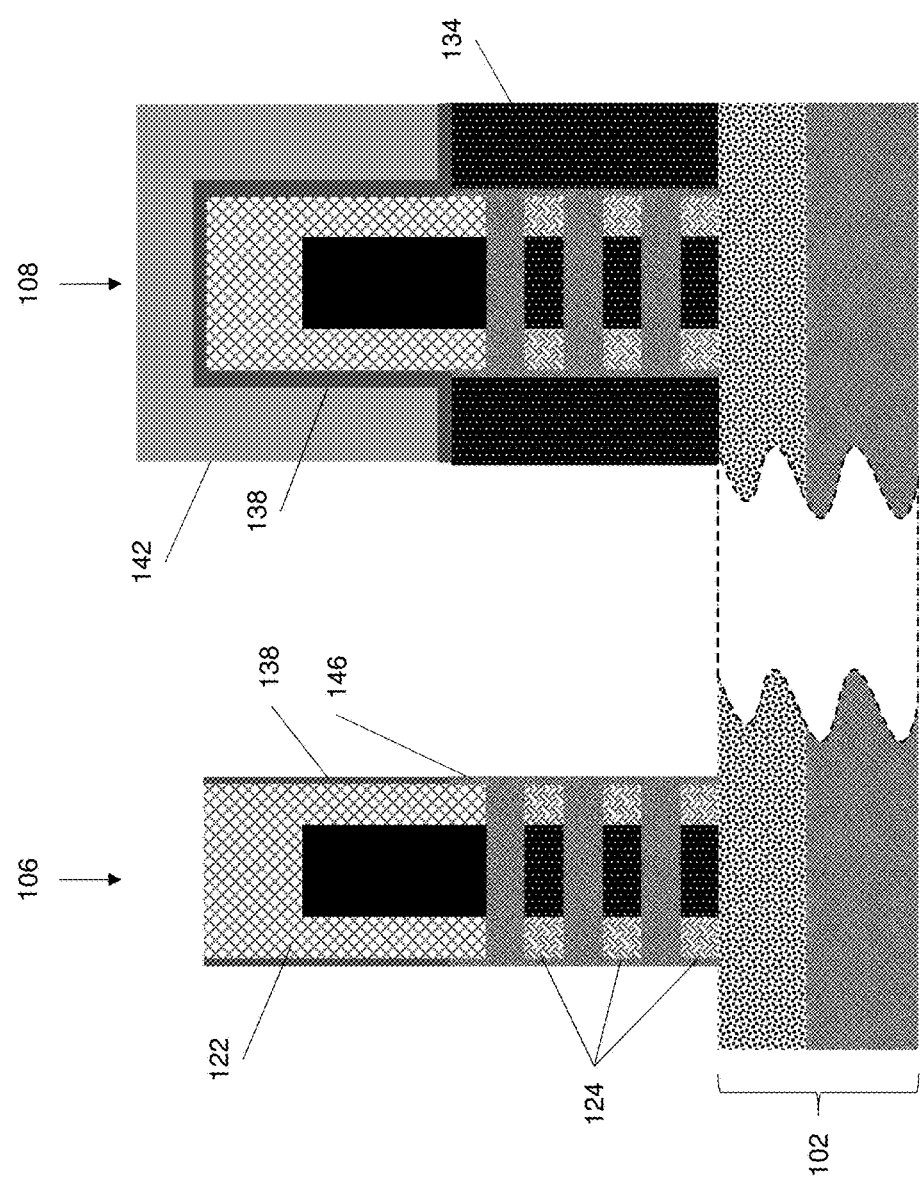
FIG. 11 shows a cross sectional view of removing a portion of the first epitaxial region on the first nanosheet stack in accordance with the present disclosure.

FIGS. 10 and 11 show processes including masking second nanosheet stack 108 and exposing first nanosheet 106. Similarly as discussed above regarding FIG. 6, a soft mask 142 may be deposited on nanosheet stacks 106, 108. Soft mask 142 may include an organic planarization layer (OPL) or other soft mask material. Soft mask 142 may be deposited directly on second liner 138 covering nanosheet stacks 106, 108. In one embodiment, soft mask 142 may include a patterning mask such as a photoresist mask (not shown separately) that may be deposited over the OPL. The photoresist mask may be patterned and etched using a now known or later developed technique, for example lithography, that is capable of exposing first nanosheet stack 106 while second nanosheet stack 108 remains masked, as shown in FIG. 10. The process of exposing first nanosheet 106 may include removing soft mask 142 on first nanosheet stack 106 and removing second liner 138 from first epitaxial region 126 on first nanosheet stack 106. Second liner 138 may be removed with an etch selective to first epitaxial region 126. In one embodiment, second liner 138 may be removed with a timed anisotropic etch such that second liner 138 is removed from first epitaxial region 126, but remains on sidewalls of gate hard mask 122, as shown. FIG. 11 shows the result of a process including partially removing first epitaxial region 126 on first nanosheet stack 106. First epitaxial region 126 may be partially removed with an anisotropic etch selective to substrate 102. In one embodiment, as shown in FIG. 11, the remaining portion of second liner 138 on first nanosheet stack 106 may act as a mask such that inner spacers 124 remain enveloped by a portion of first epitaxial region 126 (shown in FIG. 11). In one embodiment, a remaining portion 146 of first epitaxial region 126 envelopes inner spacers 124.

Figure 12:
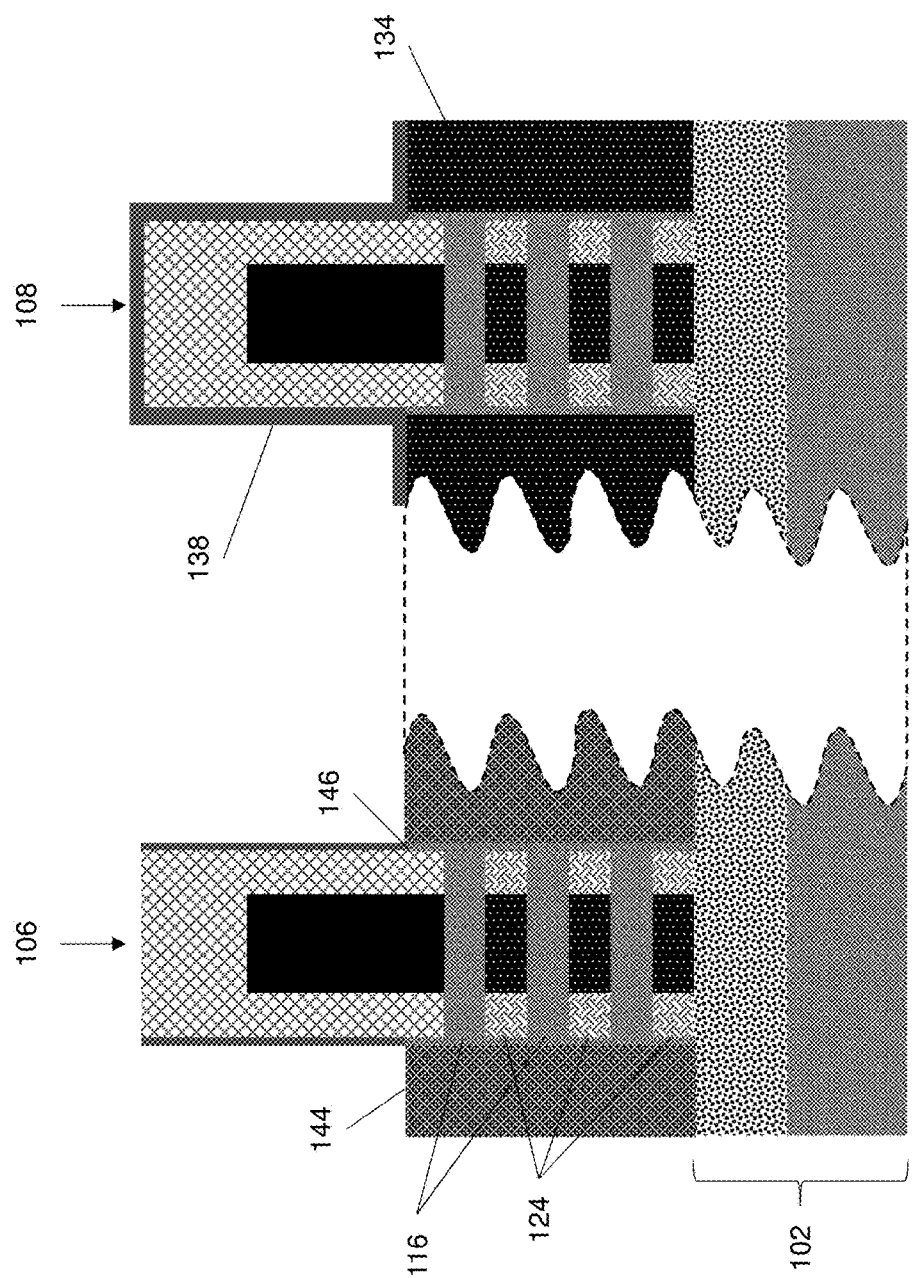
FIG. 12 shows a cross sectional view of forming n-type source/drain regions on the first nanosheet stack in accordance with the present disclosure.

FIG. 12 shows processes similar as discussed above regarding FIG. 7, including removing soft mask 142 (soft mask 142 shows in FIG. 11) from second nanosheet stack 108 and forming a pair of n-type source/drain regions 144 on first nanosheet stack 106. In one embodiment, n-type source/drain regions may include epitaxially grown semiconductor material such as silicon or silicon carbide. N-type source/drain regions 144 may include n-type dopants such as phosphorous, or arsenic. In one particular embodiment, n-type source/drain regions 144 may be epitaxially grown phosphorous-doped silicon (Si). N-type source/drain regions 144 may be epitaxially grown from remaining portions 146 of first epitaxial region 126 (first epitaxial region 126 shown in FIG. 10). Similarly as described above regarding FIG. 7, one advantage of this embodiment may be that the remaining portions of first epitaxial region 146 envelope and protect inner spacers 124. Another possible advantage of the present embodiment is that it may be quicker and/or easier to reliably grow n-type source/drain regions 144 from the remaining portion of first epitaxial region 146 compared to epitaxially growing n-type source/drain regions 144 from nanosheets 116 because of the larger uniform surface area of the remaining portion of first epitaxial region 146 compared to sidewalls of nanosheets 116.

Figure 13:
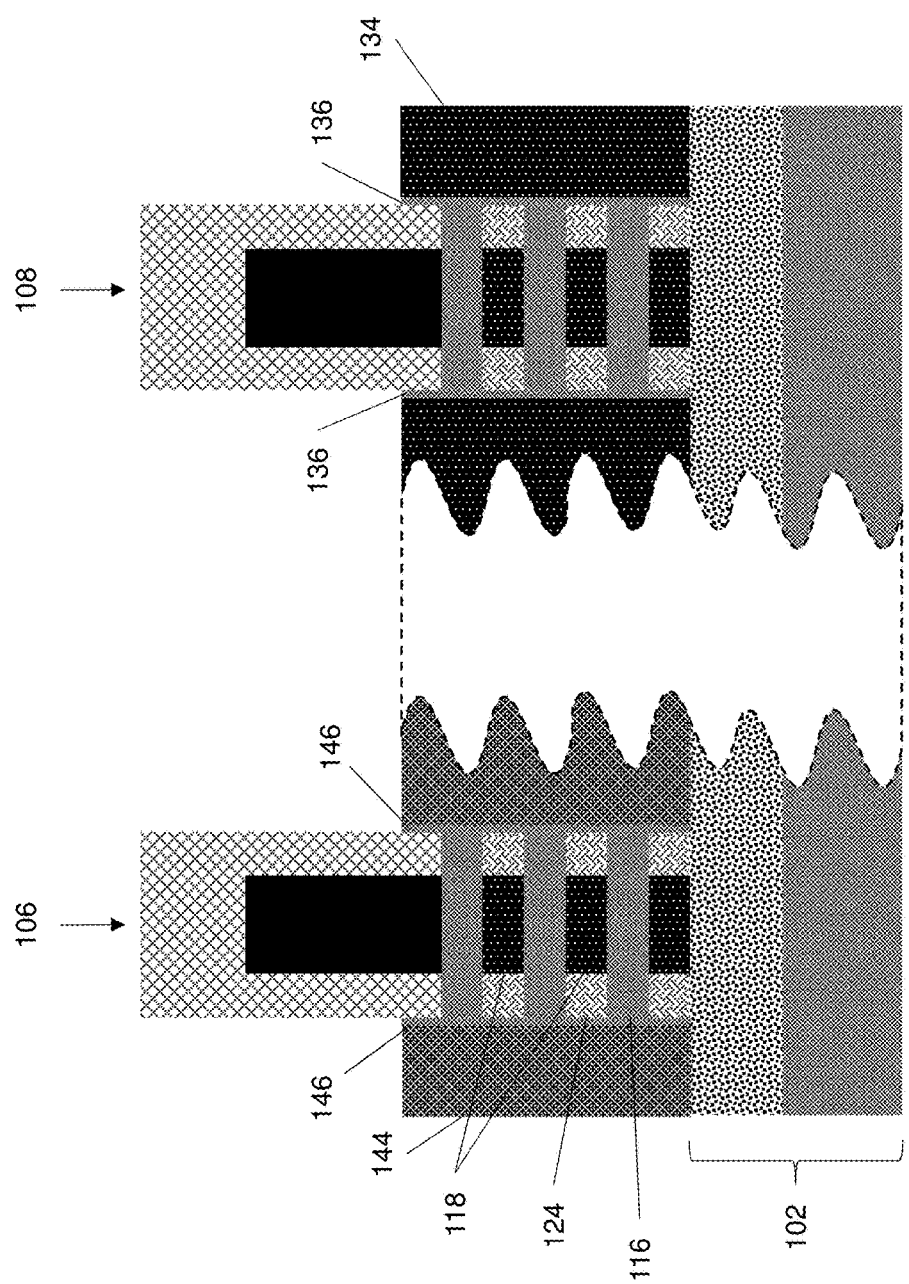
FIG. 13 shows a cross sectional view of a first and second nanosheet device in accordance with the present disclosure.

FIG. 13 shows a process of removing second liner 138 (second liner 138 shown in FIG. 12) from nanosheet stacks 106, 108. Second liner 138 may be removed similarly as discussed above regarding first liner 128 and FIG. 8, and the detailed processes are not repeated here for brevity. The resulting structure shown in FIG. 13 may include first nanosheet stack 106 and second nanosheet stack 108 formed on substrate 102. Nanosheet stacks 106, 108 may be formed directly adjacent to each other on the same substrate 102. Nanosheet stacks 106, 108 may include vertically spaced nanosheets 116. A plurality of sacrificial layers 118 may be disposed between each nanosheet 116. In one embodiment, plurality of inner spacers 124 may be disposed between each nanosheet 116 on lateral ends of sacrificial layers 118. In one embodiment, a pair of vertically extending semiconductor layers 136 (described above as the remaining portion 136 of first epitaxial region 126 on second nanosheet stack 108) may be disposed on second nanosheet stack 108. Semiconductor layers 136 may envelope and protect inner spacers 124, and may also increase a rate of epitaxial growth of semiconductor source/drain regions 134/144, compared to epitaxially growing source/drain regions 134/144 from the sidewalls of nanosheets 116 themselves, as explained above. In one embodiment, semiconductor layers 136 may contact each nanosheet 116 of second nanosheet stack 108, and envelope inner spacers 124 of second nanosheet stack 108. P-type source/drain regions 134 may be disposed on substrate 102 in direct contact with semiconductor layers 136. In one embodiment, a pair of vertically extending semiconductor layers 146 (described above as the remaining portion 146 of first epitaxial region 126 on first nanosheet stack 106) may be disposed on first nanosheet stack 106. In one embodiment, semiconductor layers 146 may contact each nanosheet 116 of first nanosheet stack 106, and envelope inner spacers 124 of first nanosheet stack. N-type source/drain regions 144 may be disposed on substrate 102 in direct contact with semiconductor layers 146. In one embodiment, n-type source/drain regions 144 may be in direct contact with nanosheets 116 of first nanosheet stack 106.

In some embodiments, after formation of n-type source/drain regions 144 and p-type source/drain regions 134, nanosheet stacks 106, 108 may be thermally annealed to promote movement of dopants from source/drain regions 144, 134 to respective junctions between nanosheets 116 and respective vertically extending semiconductor layers 146, 136. In other words, after thermally annealing nanosheet stacks 106, 108, vertically extending semiconductor layers 146, 136 may include the same dopants as respective source/drain regions 144, 134. (I.e., vertically extending semiconductor layers 146 on nanosheet stack 106 having n-type source/drain regions 144 may include n-type dopants, and vertically extending semiconductor layers 136 on nanosheet stack 108 having p-type source/drain regions 134 may include p-type dopants.) In some embodiments, after thermally annealing nanosheet stacks 106, 108, lateral ends of nanosheets 116 may also include the same dopants as respective source/drain regions 144, 134. In some embodiments, such an anneal may reduce resistance at the junction between nanosheets 116 and respective vertically extending semiconductor layers 146, 136.

Figure 14:
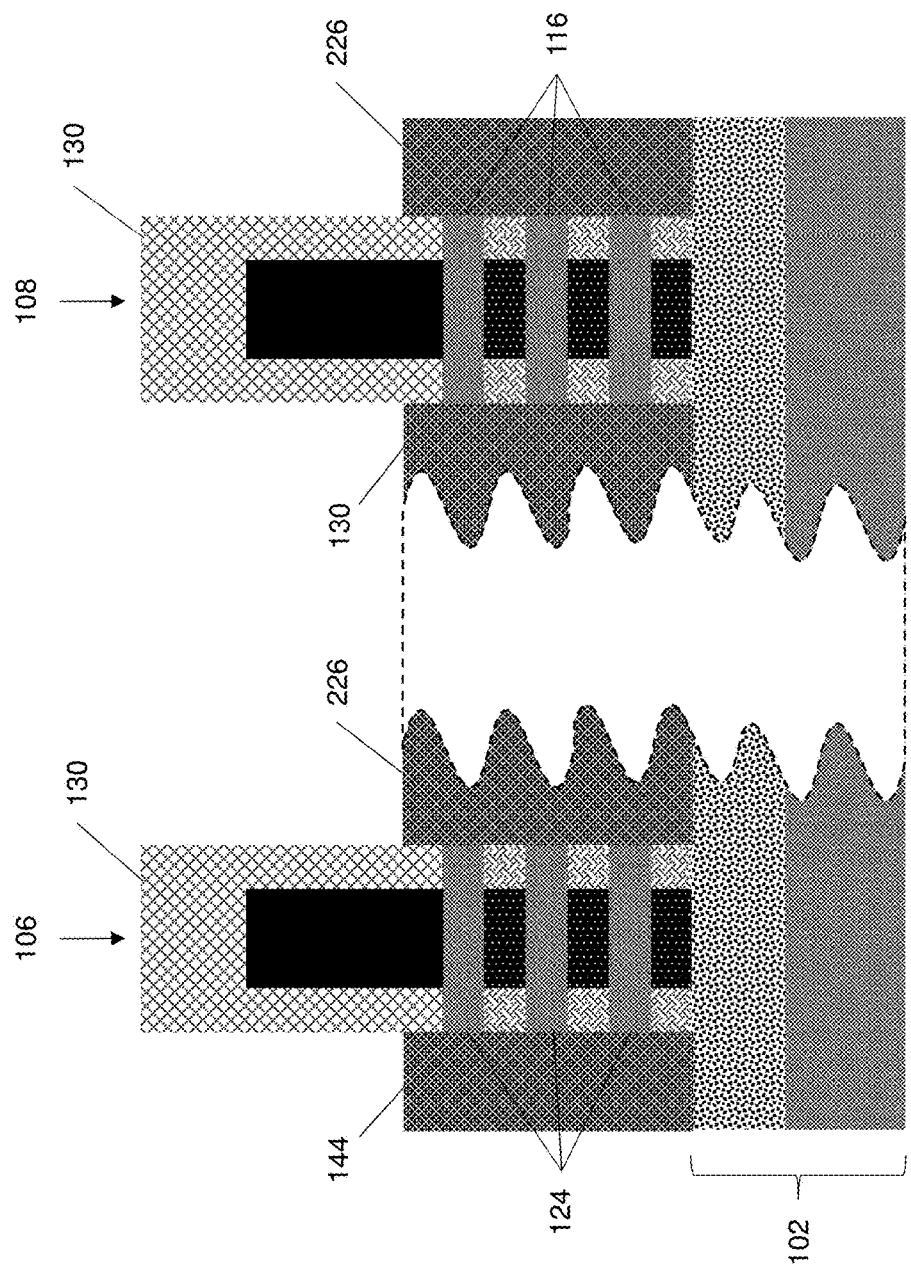
FIG. 14 shows a cross sectional view of growing an n-type doped epitaxy on the first and second nanosheet stacks in accordance with an alternative embodiment of the present disclosure.

FIG. 14 shows an alternative embodiment of the present disclosure. Starting with first and second nanosheet stack 106, 108 having inner spacers 124 as described above regarding FIG. 3, FIG. 14 shows a process of forming epitaxial regions similar as described above regarding FIG. 4. Unlike FIG. 4 however, FIG. 14 shows forming a first epitaxial region 226 that may include n-type doped silicon, compared to first epitaxial region 126 of FIG. 4 that may include undoped silicon. In one embodiment, first epitaxial region 226 may include n-type source/drain regions 144 on nanosheet stacks 106 that will become NFET devices. Similarly as described above regarding FIG. 4, first epitaxial region 226 may be epitaxially grown from nanosheets 116.

As shown in FIG. 14, first epitaxial region 226 may be grown such that it envelopes inner spacers 124. First epitaxial region 226 may provide physical support for the fragile inner spacers 124 and nanosheets 116.

Figure 15:
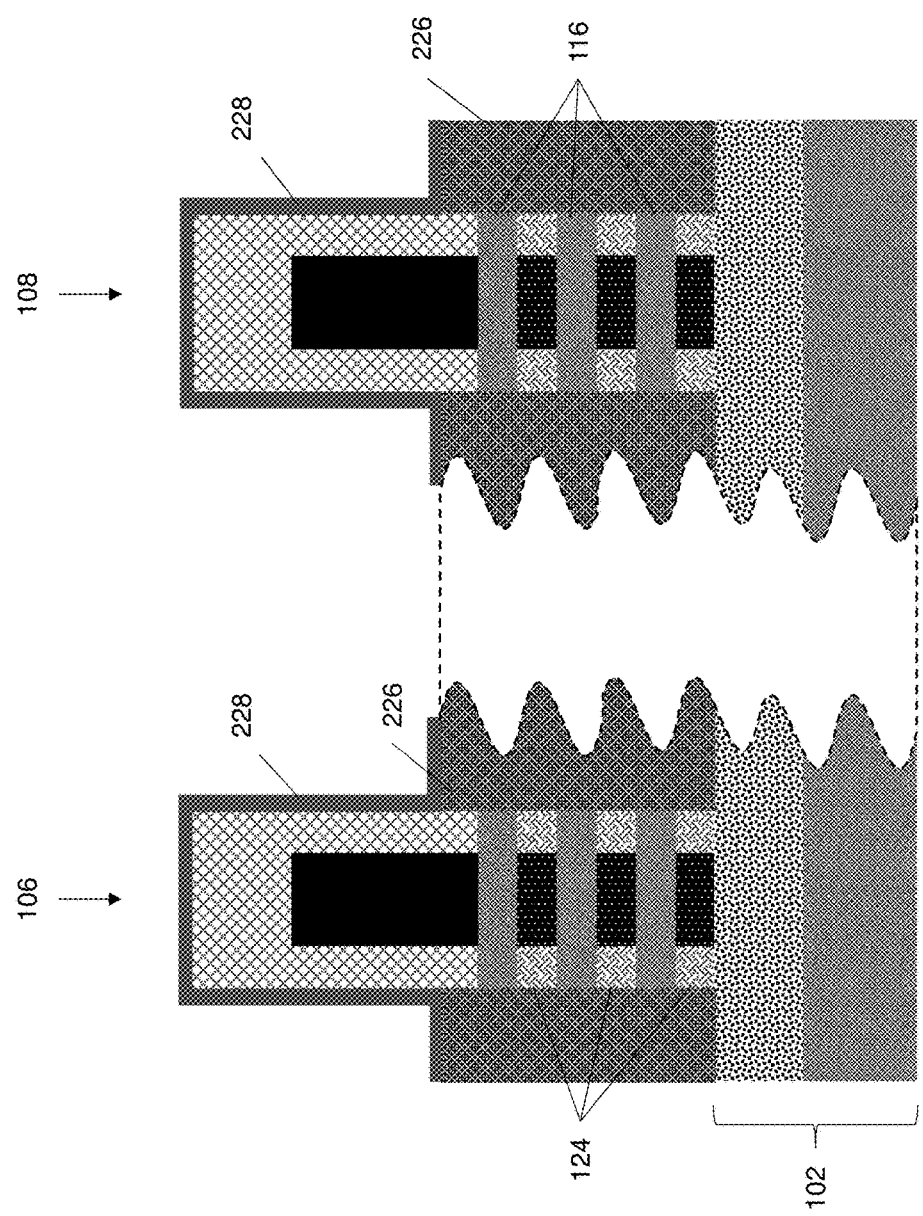
FIG. 15 shows a cross sectional view of forming a liner in accordance with an alternative embodiment of the present disclosure.

FIG. 15 shows a process of the alternate embodiment beginning at FIG. 14 including forming first liner 228 similarly to the forming of first liner 128 described above regarding FIG. 5. Similarly to first liner 128, first liner 228 shown in FIG. 15 may be formed on an exposed surface 130 of nanosheet stacks 106, 108 (exposed surface 130 of nanosheet stacks 106, 108 shown in FIG. 14). In one embodiment, first liner 228 may be formed conformally over exposed surface 130. In such an embodiment, first liner 228 may be conformally formed on first epitaxial region 226, and gate hard mask 122. It should be noted that first epitaxial region 226 may prevent first liner 228 from being formed on inner spacers 124. In one embodiment, first liner 228 may include a dielectric material. In one particular embodiment, first liner 228 may include silicon nitride (SiN).

Figure 16:
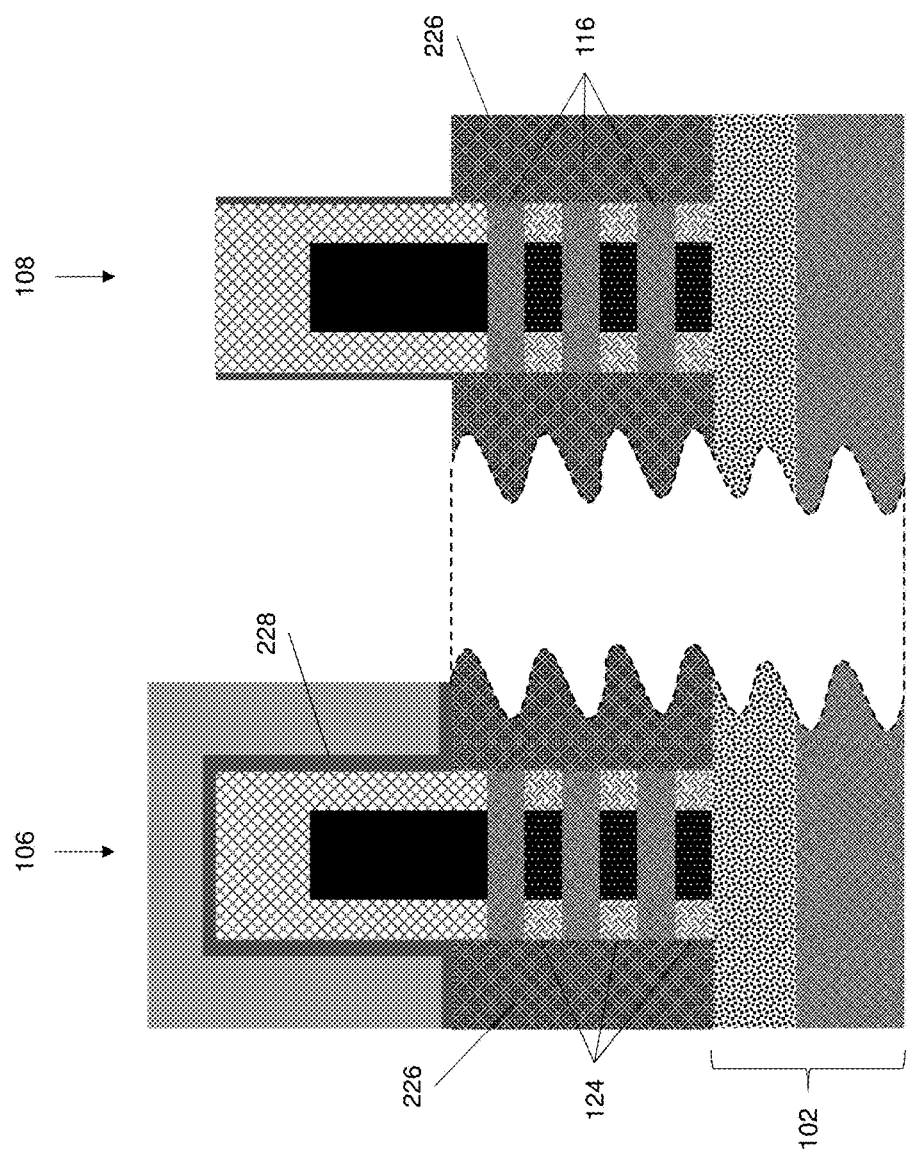
FIG. 16 shows a cross sectional view of masking the first nanosheet stack in accordance with an alternative embodiment of the present disclosure.
Figure 17:
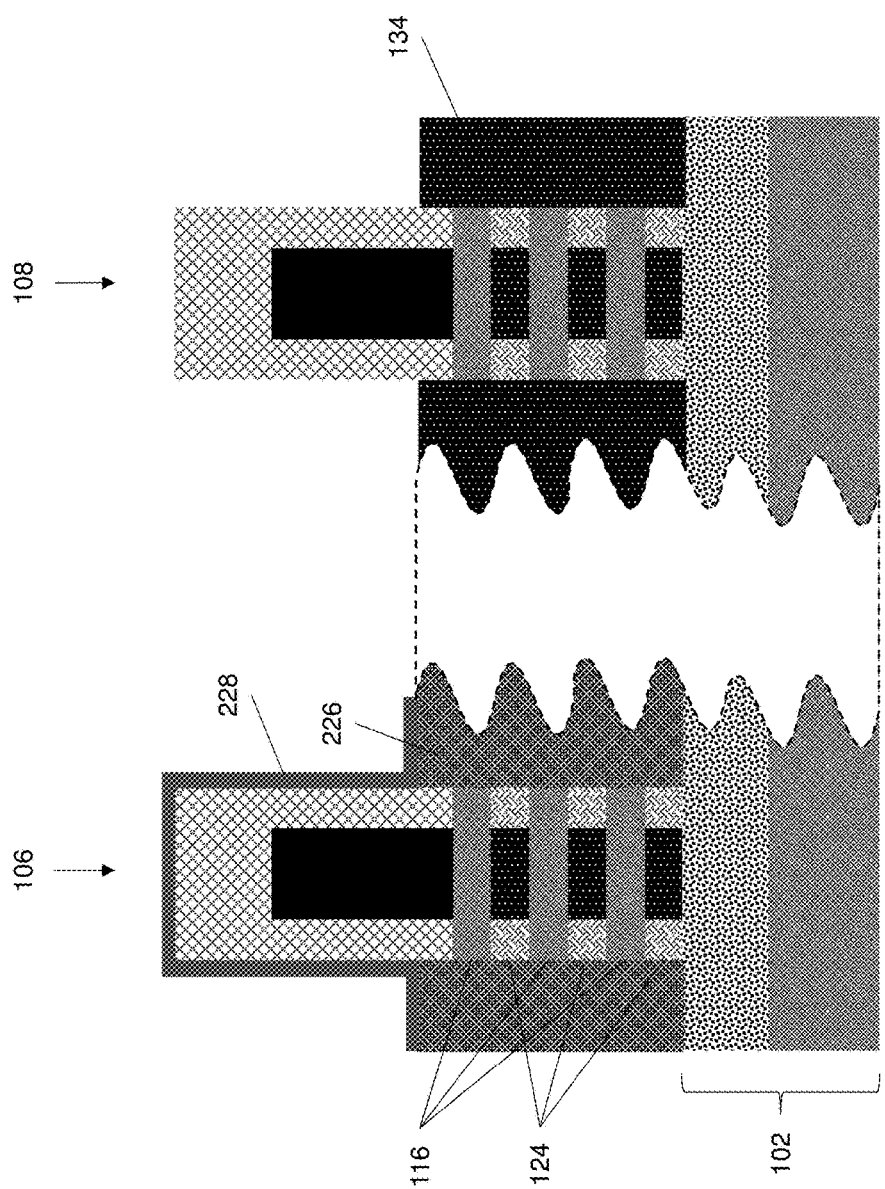
FIG. 17 shows a cross sectional view of removing the n-type doped epitaxy from the second nanosheet stack and growing p-type doped source/drain regions on the second nanosheet stack in accordance with an alternative embodiment of the present disclosure.

FIGS. 16 and 17 show processes of the alternate embodiment beginning at FIG. 14. These processes are similar to the masking and etching processes described above regarding FIGS. 6 and 7, and every detail is not reiterated here for brevity. One difference shown in the embodiment of FIG. 17 may be that the entire first epitaxial region 226 may be removed from second nanosheet stack 108. In other words, there may be no remaining portion of first epitaxial region 226 on second nanosheet stack 108, as shown in FIG. 17. In this embodiment, since first epitaxial region 226 may include n-type doped semiconductor material, first epitaxial region 226 may need to be removed from any nanosheet stack 108 on which p-type source/drain regions 134 will be formed. In one embodiment, first epitaxial region 226 may be removed with an etch selective to nanosheets 116, inner spacers 124, and substrate 102. FIG. 17 shows the process of forming p-type source/drain regions 134 on second nanosheet stack 108. In this embodiment, p-type source/drain regions 134 may be formed by epitaxially growing doped SiGe from nanosheets 116 of second nanosheet stack 108. In one embodiment, p-type source/drain regions 134 may include boron-doped SiGe.

Figure 18:
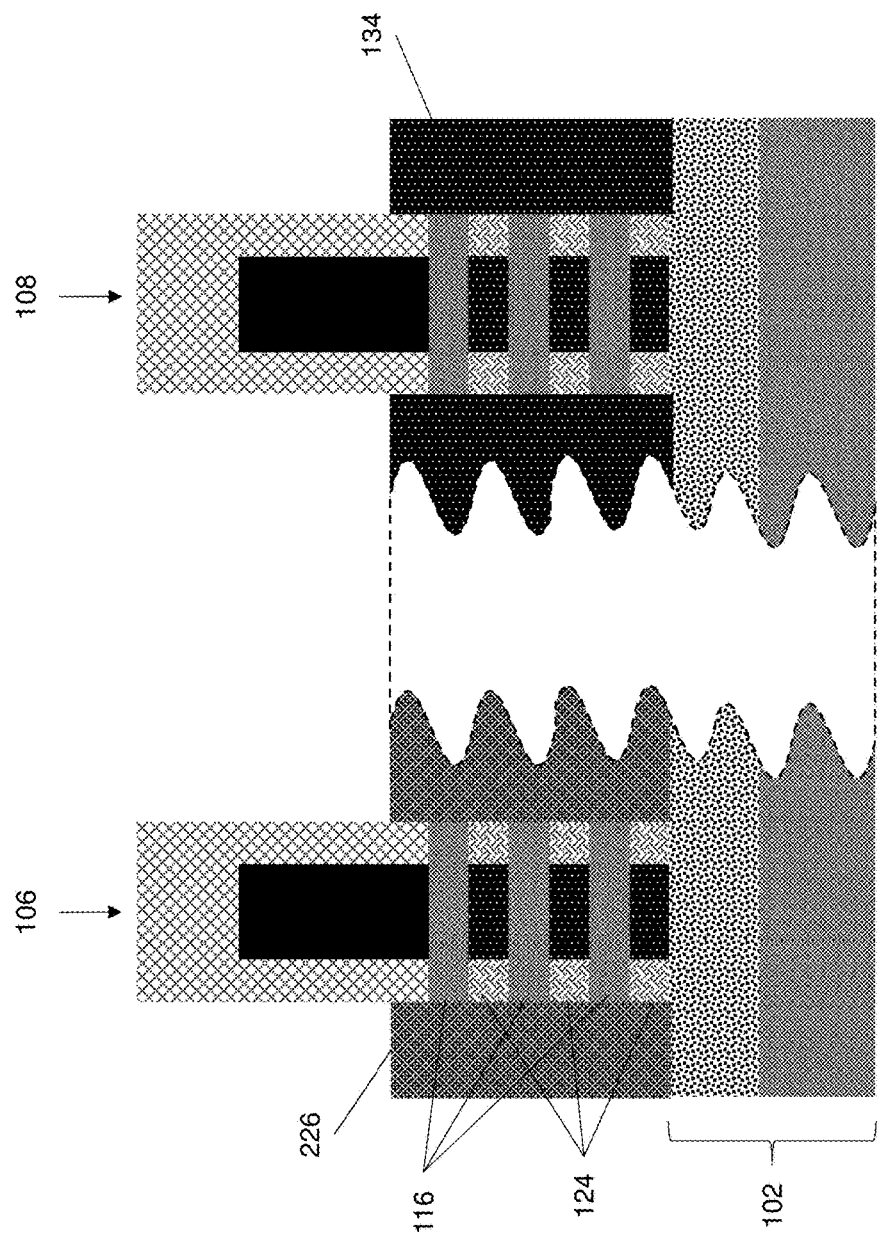
FIG. 18 shows a cross sectional view of a first and second nanosheet device in accordance with an alternative embodiment of the present disclosure.

FIG. 18 shows a process of the alternate embodiment beginning at FIG. 14 including removing first liner 228 (first liner 228 shown in FIG. 17) from first nanosheet stack 106. FIG. 18 also shows the resulting structure formed by the embodiment beginning at FIG. 14. This structure may be similar to the structure described above in FIG. 13, and every detail is not reiterated here for brevity. It should be noted that the structure shown in FIG. 18 may not include the vertical layers of undoped silicon 136, 146 (shown in FIG. 13) extending between nanosheets 116 and enveloping inner spacers 124. In this embodiment, nanosheets 116 of the second nanosheet stack 108 may include partial n-type doping because n-type doped first epitaxial region 226 may have been in direct contact with nanosheets 116 of second nanosheet stack 108, as shown in FIG. 14. For example, during previous processes the direct contact between nanosheets 116 of second nanosheet stack 108 and first epitaxial region 226 may have caused n-type dopants from first epitaxial region 226 to diffuse into nanosheets 116 of second nanosheet stack 108. As should be understood from the above detailed description, the resulting device formed from first nanosheet stack may be a NFET transistor device, and the resulting device formed from the second nanosheet stack may be a PFET transistor device.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:
1. A semiconductor device comprising:
a first and second nanosheet stack on a substrate, the first and the second nanosheet stack being adjacent to each other and each including vertically spaced nanosheets;
a pair of semiconductor layers disposed on the second nanosheet stack in contact with sidewalls of the nanosheets of the second nanosheet stack, each of the pair of semiconductor layers extending vertically from a lowermost nanosheet of the second nanosheet stack to an uppermost nanosheet of the second nanosheet stack;
a pair of n-type source/drain regions disposed on the substrate adjacent to the first nanosheet stack; and
a pair of p-type source/drain regions disposed on the substrate adjacent to the second nanosheet stack and in direct contact with the pair of semiconductor layers.

2. The semiconductor device of claim 1, wherein the p-type source/drain regions include boron-doped silicon germanium (SiGe).

3. The semiconductor device of claim 2, further comprising a pair of semiconductor layers disposed on the first nanosheet stack in contact with sidewalls of the nanosheets of the first nanosheet stack, each of the pair of semiconductor layers extending vertically from a lowermost nanosheet of the first nanosheet stack to an uppermost nanosheet of the first nanosheet stack, wherein the pair of semiconductor layers on the first nanosheet stack includes n-type dopants.

4. The semiconductor device of claim 2, wherein the pair of semiconductor layers on the second nanosheet stack includes p-type dopants.

5. The semiconductor device of claim 1, wherein the pair of semiconductor layers is a first pair of semiconductor layers, and the semiconductor device further comprises: a second pair of semiconductor layers disposed on the first nanosheet stack in contact with sidewalls of the nanosheets of the first nanosheet stack, between the sidewalls of the nanosheets of the first nanosheet stack and the pair of n-type source/drain regions, each of the second pair of semiconductor layers extending vertically from a lowermost nanosheet of the first nanosheet stack to an uppermost nanosheet of the first nanosheet stack.

6. The semiconductor device of claim 5, wherein the pair of n-type source/drain regions are in direct contact with the second pair of semiconductor layers.

7. The semiconductor device of claim 1, wherein the first nanosheet stack is adjacent to the second nanosheet stack.

8. The of claim 7, wherein the first nanosheet stack includes a NFET device, and the second nanosheet stack includes a PFET device.

9. The semiconductor device of claim 7, wherein the nanosheets of the second nanosheet stack include partial n-type doping.

10. The semiconductor device of claim 1, further comprising a plurality of spacing members between each of the nanosheets, each of the plurality of spacing members including a metal gate material and a pair of inner spacers disposed on lateral ends of the metal gate material, and wherein the pair of semiconductor layers envelope each of the inner spacers of the second nanosheet stack.

* * * * *